United States Patent [19]
Kawaguchi et al.

[11] Patent Number: 5,763,055
[45] Date of Patent: Jun. 9, 1998

[54] OPTICAL SINGLE CRYSTALLINE ARTICLES AND OPTICAL ELEMENTS USING SUCH OPTICAL SINGLE CRYSTALLINE ARTICLES

[75] Inventors: Tatsuo Kawaguchi, Nagoya; Kazuyuki Kaigawa, Nishikasugai-Gun; Minoru Imaeda, Nagoya, all of Japan

[73] Assignee: NGK Insulators, Ltd., Japan

[21] Appl. No.: 717,190

[22] Filed: Sep. 20, 1996

[30] Foreign Application Priority Data

Sep. 22, 1995 [JP] Japan .................................. 7-244236

[51] Int. Cl.$^6$ .................................................... B32B 3/00
[52] U.S. Cl. .......................... 428/195; 428/212; 428/688; 428/697; 428/913; 385/130; 385/131; 359/322; 359/325
[58] Field of Search .................................. 428/195, 212, 428/688, 697, 913; 385/130, 131; 359/322, 325

[56] References Cited

FOREIGN PATENT DOCUMENTS

| | | |
|---|---|---|
| 0 515 682 | 12/1992 | European Pat. Off. . |
| 0 674 027 | 9/1995 | European Pat. Off. . |
| 2 267 975 | 12/1993 | United Kingdom . |

OTHER PUBLICATIONS

Journal of Crystal Growth 46 (1979) pp. 314–322; "LPE Growth of Li(Nb, Ta)O3 Solid–Solution Thin Film Waveguides on LiTaO3 Substrates," by Susumu Kondo et al.

Applied Physics Letters, vol. 26, No. 1 (1 Jan. 1975), "Optical Waveguide of LiNbO3 Thin Film Grown by Liquid Phase Epitaxy," by Shintaro Miyazawa et al.

Journal of Crystal Growth 50 (1980) pp. 291–298, "LiNbO3 and LiTaO3 Growth by the Capillary Liquid Epitaxial Technique," by T. Fukuda et al.

*Primary Examiner*—William Krynski
*Assistant Examiner*—Elizabeth Evans
*Attorney, Agent, or Firm*—Parkhurst & Wendel, L.L.P

[57] ABSTRACT

An optical single crystalline article comprising a substrate made of an optical single crystal and an epitaxial film formed on said substrate and made of an optical material, wherein a crystalline structure of said epitaxial film is a relaxed structure.

15 Claims, 6 Drawing Sheets

FIG_3a
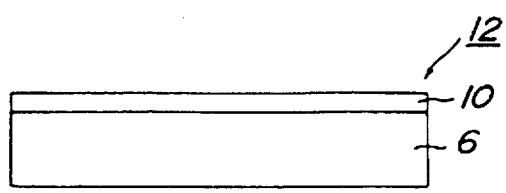
FIG_3b
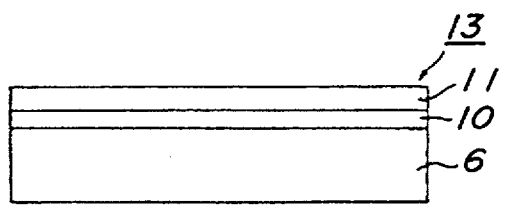

OPTICAL SINGLE CRYSTALLINE ARTICLES AND OPTICAL ELEMENTS USING SUCH OPTICAL SINGLE CRYSTALLINE ARTICLES

BACKGROUND OF THE INVENTION (1) Field of the Invention

The present invention relates to optical single crystalline articles each comprising a substrate made of an optical single crystal and an epitaxial film formed on said substrate as well as to optical elements comprising such optical single crystalline articles, such as second harmonic-generation devices (SHG devices), optical modulators, and substrates for optical switches.

(2) Related Art Statement

Lithium niobate ($LiNbO_3$) single crystals and lithium tantalate are expected as optoelectronics materials for SHG devices, optical modulators, and substrates for optical switches. Since the liquid phase epitaxial process can produce a single crystalline film at a lower temperature as compared with the Czochralski method, the former is expected as a process for the formation of a thin film having a high quality with high crystallinity.

For Example, Journal of Crystal Growth, No. 46, 1979, pp 314–322 describes the production of a solid solution film of lithium niobate-lithium tantalate on a single crystalline substrate of lithium tantalate by the liquid phase epitaxial process. Applied Physics Letters, Vol. 26, No. 1, 1975, pp 8–10 describes the formation of a single crystalline film of lithium niobate on a single crystalline substrate of lithium tantalate by the liquid phase epitaxial process. Journal of Crystal Growth, No. 50, 1980, pp 291–298 describes the production of a single crystalline film of lithium niobate on a single crystalline substrate of lithium tantalate by the capillary liquid epitaxial process. However, this process principally differs from the ordinary liquid phase epitaxial process, and this article does not describe the formation of a solid solution film of lithium niobate-lithium tantalate.

In particular, a process for the production of an optical waveguide substrate using, as an optical waveguide, a single crystalline film formed by the liquid phase epitaxial process and having a refractive index higher than that of a single crystalline substrate has been recently noted as a process for the production of an optical waveguide device having a high quality.

Lithium niobate has a refractive index smaller than that of lithium tantalate. Lithium niobate and lithium tantalate produce a solid solution at any ratio, and as the rate of tantalum increases, the refractive index of the solid solution decreases. For this reason, lithium tantalum single crystalline substrates have been principally used as substrates for the formation of lithium niobate-lithium tantalate solid solution thin films or lithium niobate thin films. The reason is that since lithium tantalate has a refractive index smaller than that of lithium niobate and that of the lithium niobate-lithium tantalate solid solution and if the lithium tantalate single crystalline substrate is used, each of the above thin films can be used as an optical waveguide.

With respect to the lithium niobate single crystalline substrates, single crystalline substrates having an optical grade with good crystallinity are available even at present. However, at present the lithium tantalate single crystalline substrate produced by the Czochralski method has poorer crystallinity as compared with the lithium niobate single crystalline substrate. In the epitaxial growth process, the crystallinity of the substrate poses direct influence upon the crystallinity of an epitaxial film grown on this substrate. Therefore, in order to produce an epitaxial film having such a quality as practically used for the optical element, a substrate having an optical grade must be used, too. In other words, even if a single crystalline film is formed on a lithium tantalate single crystalline substrate inherently having poor crystallinity, it is difficult to obtain such a single crystalline film having crystallinity better than that of a film formed on a lithium niobate single crystalline substrate having an optical grade.

Since the Curie temperature of the lithium niobate single crystalline substrate is about 1,200° C. and the crystallinity of the substrate is fully stabilized at a film-forming temperature according to the liquid phase epitaxial process, the lithium niobate single crystal is suitable as a material for the substrate. Further, since the single crystalline substrate having a high quality is produced by the Czochralski method as mentioned above, it is easily available. However, it is also demanded that the refractive index of such a substrate is changed by varying the composition ratio of niobium and lithium or adding another metal element. With respect to the substrates made of such single crystals, substrates having good crystallinity have not been produced, and its mass production is impossible.

SUMMARY OF THE INVENTION

An object of the present invention is to provide an optical article in which an epitaxial film is provided on a substrate made of an optical single crystal such as a single crystal of lithium niobate or a single crystal of lithium tantalate, wherein crystallinity of the epitaxial film is excellent, and which optical article enables the use of an optical single crystalline substrate having various and wide ranges of crystallinities and grades.

The present invention relates to an optical single crystalline article which includes a substrate made of an optical single crystal and an epitaxial film formed on said substrate and made of an optical material, wherein a crystalline structure of said epitaxial film is a relaxed structure. The invention also relates to an optical element using such an optical single crystalline article.

The present inventors have formed epitaxial films with various compositions on optical single crystalline substrates possessing various crystallinities and compositions by a process mentioned later, and made studies to examine the crystallinity of the resulting epitaxial films. As a result, it was clarified that contrary to the common knowledge that the crystallinity of the epitaxial film directly reflects that of the substrate, the epitaxial film having good quality is obtained without being influenced by the crystallinity of the substrate. The present inventors investigated such epitaxial films having good quality, and consequently discovered that an interface between the optical single crystalline substrate and the epitaxial film has a relaxed structure.

This will be explained. That is, according to the common knowledge in the formation of the epitaxial films, strain of the epitaxial film has been decreased by making the difference in the lattice constant between the epitaxial film and the substrate as small as possible. In addition, the epitaxial film has been epitaxially grown by making the epitaxial film identical with that of the substrate. However, according to the inventors' examination, the epitaxial film had a strained structure due to the influences of the crystallinity of the substrate and the lattice constant. Accordingly, if a substrate having no good crystallinity is used, the crystallinity of an epitaxial film formed on the substrate is influenced by the crystallinity of the substrate and the lattice constant, and it was difficult to produce the epitaxial film having crystallinity better than that of the substrate.

However, the present inventors have succeeded in producing the epitaxial film having good crystallinity, particularly of an optical grade, without being directly influenced by the crystallinity of the optical single crystalline substrate, by heteroepitaxially growing the epitaxial film on the optical single crystalline substrate and at that time making the structure of the interface between the optical single crystalline substrate and the epitaxial film "relaxed".

Here, the strained structure and the relaxed structure will be explained. The strain structure is a structure in which the lattice of the epitaxial film is strained (deformed) to match the lattices at the interface between the epitaxial film and the substrate. On the other hand, the relaxed structure is a structure in which inversion occurs at the interface between the epitaxial film and the substrate, the lattice of the epitaxial film does not match that of the substrate at that interface, and the epitaxial film is released from the strain stress.

These structures can be identified by asymmetrical reflection reciprocal-lattice mapping. FIG. 1 is a diagram showing an asymmetrical reflection reciprocal lattice mapping corresponding to the strain structure, and FIG. 2 is a diagram showing that corresponding to the relaxed structure. In FIGS. 1 and 2, each contour line shows an X-ray diffraction intensity. A lower peak indicates reciprocal lattice points of the substrate, and an upper peak indicates those of the epitaxial film. The abscissa and the ordinate represent reciprocal lattice points in [110] and [001] directions on the reciprocal lattice space, respectively. In FIG. 1, the reciprocal lattice points of the epitaxial film is present immediately above that of the substrate, which shows that both match their lattices. Further, the reciprocal lattice points of the substrate and those of the epitaxial film are relatively wider as compared with FIG. 2, which indicates the existence of the strain of the lattice level.

On the other hand, in FIG. 2, the reciprocal lattice points of the epitaxial film are present at for example 5° inclined from a line extending vertically immediately above the reciprocal lattice points of the substrate. This shows that their lattices are not matched. The reciprocal lattice points of the substrate and those of the epitaxial film are spread relatively smaller as compared with FIG. 1, which means that the strain is almost released.

These and other objects, features and advantages of the invention will be appreciated upon reading of the following description of the invention when conjunction with the attached drawings, with the understanding that some modifications, variations and changes of the same could be easily made by the skilled person in the art.

BRIEF DESCRIPTION OF THE DRAWINGS

For a better understanding of the invention, reference is made to the attached drawings, wherein:

FIG. 3(a) is a front view for schematically illustrating an optical single crystalline article with an epitaxial film on an optical single crystalline substrate, and FIG. 3(b) an optical single crystalline article including an optical single crystalline substrate, a first epitaxial film and a second epitaxial film functioning as an optical waveguide;

DETAILED DESCRIPTION OF THE INVENTION

The present invention will be explained in more detail.

Figure 5:
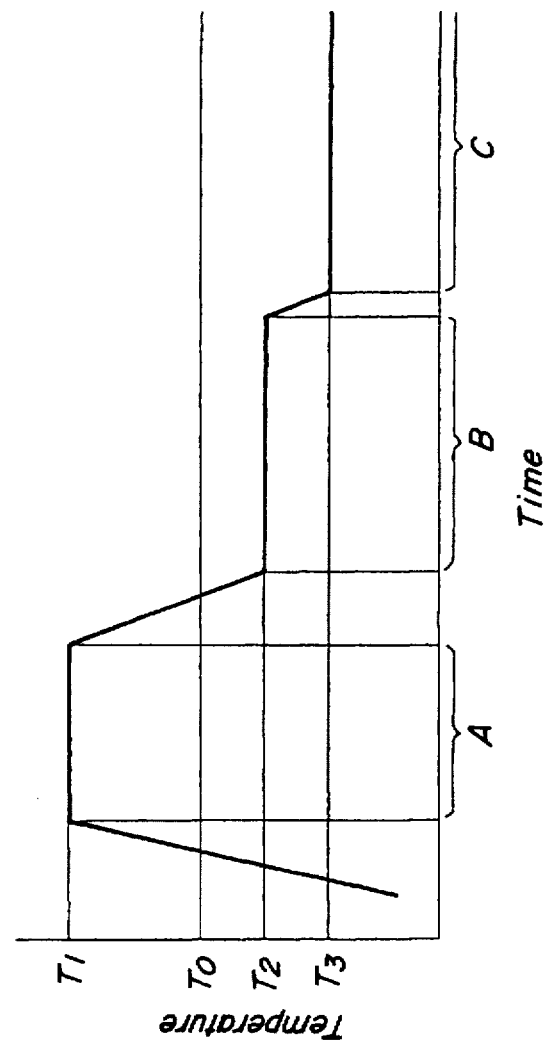
FIG. 5 is a graph schematically illustrating a temperature schedule for a melt in a liquid phase epitaxial process in which a solid phase and a liquid phase are coexistent.

In the above optical single crystalline article having the relaxed structure and the epitaxial film with good crystallinity, it is necessary that the substrate and the epitaxial film fundamentally possess similar crystalline structures, their lattice constants differ from each other, and the epitaxial film is heteroepitaxially grown (See FIG. 5). More specifically, the following may be encompassed as such single crystalline articles.

(1) The crystalline system is the same and substituting elements differ between the substrate and the epitaxial film.

(2) The crystalline system is the same, and the substituting elements are the same between the substrate and the epitaxial film, but the composition ratio of the substituent elements differs between them.

However, even if the crystalline system is not completely the same, the relaxed structure may be produced.

The crystalline systems and the compositions falling in the above two categories will be given by way of example.

(1) LN ($LiNbO_3$) and LT ($LiTaO_3$)/KLN ($K_3Li_2Nb_5O_{15}$) and KLT ($K_3Li_2Ta_5O_{15}$)/garnet materials such as YIG ($Y_3Fe_5O_{12}$) and BiIG($Bi_3Fe_5O_{12}$)

(2) LNT ($LiNb_{1-x}Ta_xO_3$), KLNT ($K_3Li_2(Ta_xNb_{1-x})_5O_{13}$), KLN($KLi_{2-x}Nb_{5+x}O_{15+2x}$), $Ba_{1-x}Sr_xNb_2O_6$

The difference in the lattice constant (lattice mismatching between the substrate and the epitaxial film is preferably not less than 0.004% from the standpoint of the production of the relaxed structure. Further, if it is more than 1%, it may be difficult to effect the epitaxial growth, which may disable the production of a film having good crystallinity.

In particular, when a substrate was made of a single crystal of lithium niobate or lithium tantalate and an epitaxial film was made of a single crystal of lithium niobate-lithium tantalate and when the lattice mismatching between them exceeded 0.8%, a optical damage characteristic was seen even if the crystallinity of the epitaxial film itself is good. Therefore, the difference in the lattice constant between the substrate and the epitaxial film is preferably not more than 0.08%.

FIGS. 3(a) and FIG. 3(b) are front views for schematically illustrating embodiments of the optical single crystalline article according to the present invention, respectively. In the optical single crystalline article 12 of FIG. 3(a), an epitaxial film 10 is formed on an optical single crystalline substrate 6. In the optical single crystalline article 13 of FIG. 3(b), a first epitaxial film 10 is formed on a optical single crystalline substrate 6, and a second epitaxial film 11 is formed on the epitaxial film 10. In this case, it is preferable that the second epitaxial film 11 is used as an optical waveguide by making the refractive index of the second epitaxial film 11 greater than that of the first one.

The optical single crystalline articles according to the present invention may be used in a wide area including substrates for various optical parts and optical elements. Such optical parts and optical elements may include, for example, optical modulators, optical switches, optical amplifiers, SHG devices (second harmonic generation devices used in optical pickups, etc., light integrated circuits for optical fiber gyrometers.

If the epitaxial film is formed by a single crystal of lithium niobate-lithium tantalate, a rare earth element may be incorporated into the single crystal as a doping component. Such a rare earth element acts as an additive element for laser oscillation. As the rare earth element, particularly Nb, Er, Tm, Ho, Dy and Pr are preferred. Further, one or more kinds of additive elements selected from the group consisting of zinc, scandium, magnesium, indium, titanium and vanadium may be incorporated into the epitaxial film or the substrate. These elements function to enhance optical damage resistance.

Figure 4A:
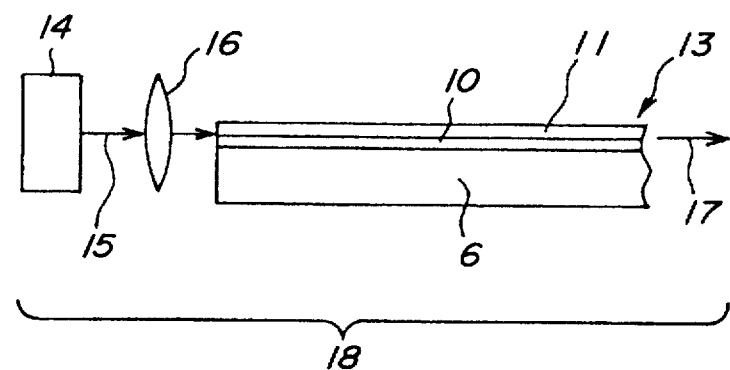
FIG. 4(a) is a schematic view for illustrating an SHG device using an optical single crystalline article according to the present invention, FIG. 4(b) a perspective view for illustrating an optical single crystalline article with a rib-shaped optical waveguide, and FIG. 4(c) a schematic view for illustrating another SHG device using an optical single crystalline article according to the present invention.

An embodiment of the optical single crystalline article according to the present invention which is to be used as an SHG device will be explained. FIG. 4(a) is a schematic view of the SHG device using the optical single crystalline article 13 in FIG. 3(b). Such an element may be used widely for an optical disc memories, medical use, photochemical use or various optical measurements.

In the SHG device 18, a laser beam source 14, an optical system 16, and the optical single crystalline article 13. An incident light is emitted from the laser beam source 14 into the optical system 16 as shown in an arrow direction 15, and the laser beam from the optical system 16 is emitted into one end face of the second epitaxial film 11 (optical waveguide) of the optical single crystalline article 13. The light is emitted as the second harmonic from the other end side of the epitaxial film 11 in an arrow direction 17.

Figure 4B:
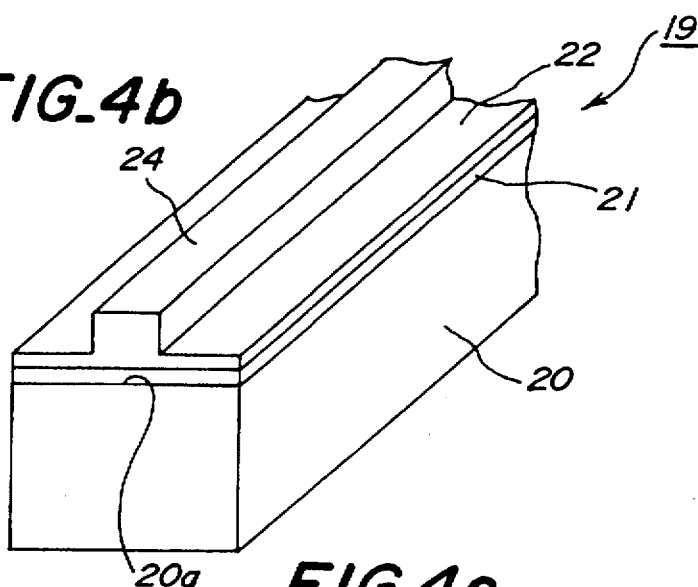

As shown in FIG. 4(b), a rib-shaped optical waveguide is formed by forming a rib through working, e.g., etching a second epitaxial film, and the optical waveguide is used to generate second harmonics. This optical single crystalline article 19 has a chip-like shape, and a first epitaxial film 21 is formed on a main face 20a of a single crystalline substrate 20. The second epitaxial film 22 is formed on this first one. In the second epitaxial film 22, the slender rib-shaped optical waveguide 24 is straightly formed. The rib-shaped optical waveguide 24 is formed by the etching or the like.

Figure 4C:
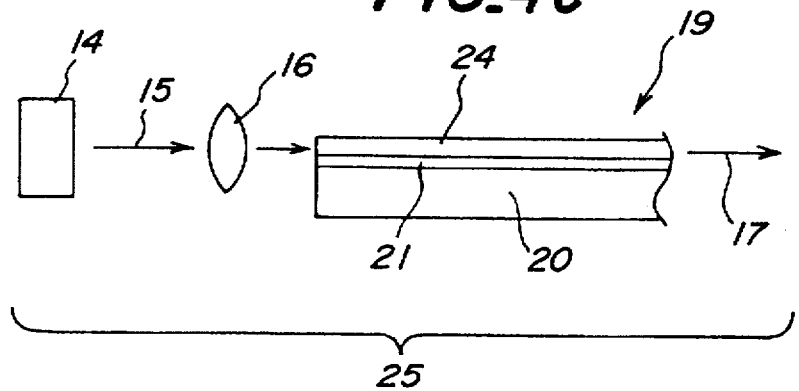

In this case, for example, as in the case of the SHG device 25 shown schematically in FIG. 4(c), a laser beam source 14, an optical system 16 and the single crystalline article 19 are arranged. An incident light is emitted from the laser beam source 14 into the optical system 16 as shown in an arrow direction 15, and the laser beam from the optical system 16 is emitted into one end face of the optical waveguide 24 of the optical single crystalline article 19. The light is emitted as the second harmonic from the other end side of the optical waveguide 24 in an arrow direction 17.

A process for the production of the optical single crystalline article according to the present invention is not limited, but for example, the following process may be employed. With reference to FIGS. 5 and 6, this process will be explained. FIG. 5 is a graph schematically showing a melt temperature schedule developed by the present inventors.

Figure 6A:
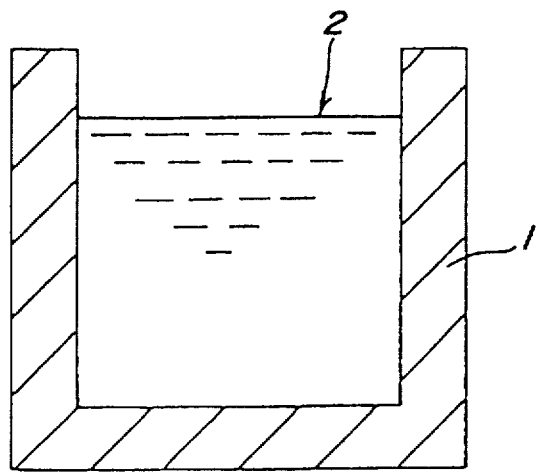
FIGS. 6(a) and 6(b) are sectional views for illustrating the state of the melt in a crucible.
Figure 6B:
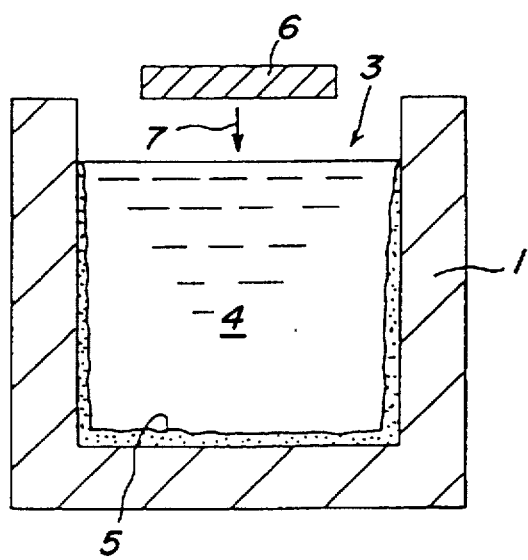

FIGS. 6(a) and 6(b) are sectional views showing the state of the melt inside a crucible 1.

First, a solute and a melt medium are charged into and mixed in the crucible 1. The saturation temperature $T_o$ of the melt is determined at a given temperature corresponding to the concentration of the solute in the melt, i.e., the charged composition. This saturation temperature can be calculated based on a liquids line. The melt is kept at a temperature $T_1$ higher than the saturation temperature To so that the solute and the melt medium may be uniformly melted. In FIG. 5, "A" corresponds to the melted state. As shown in FIG. 6(a), all the melt 2 takes a liquid phase.

Next, the melt is cooled to a solid phase-precipitating temperature $T_2$ lower than the saturation temperature $T_0$. In this state, the melt first reaches an supercooled state, but a solid phase appears from the melt if it is held at that temperature for a long time. In FIG. 5, "B" corresponds to a holding state for the precipitation of the solid phase. At that time, as shown in FIG. 6(b), the melt 3 is separated into a liquid phase portion 4 and a solid phase portion 5. The solid phase portion 5 is mainly precipitated along a wall surface of the crucible 1.

Then, the temperature of the melt is lowered to make the liquid phase portion 4 supercooled. In FIG. 5, "C" corresponds to the supercooled state. As shown in an arrow direction 7, the substrate 6 is moved down into and contacted with the liquid phase portion 4 in the supercooled state, so that a single crystalline film is epitaxially grown on the substrate. In this process, the state "B" (Temperature $T_2$) in which the solid phase and the liquid phase are stably co-existent is taken as a starting point, and the liquid phase portion is converted to the supercooled state by lowering the temperature in this stable state to the film-forming temperature $T_3$. In this way, when the solid phase and the liquid phase are stably co-existent, the concentration of the solute in the liquid phase portion is kept at the saturated concentration at the holding temperature $T_2$ so long as the temperature does not exceed the saturation temperature of the entire system.

The present inventors used substrates having various crystalline levels, and tried to form epitaxial films thereon. Then, the inventors confirmed that if the above-mentioned relationship between the substrate and the epitaxial film is maintained, the epitaxial film having good crystallinity can be formed without being affected by the crystallinity of the substrate. This reason is not clear, but is considered as follows.

According to the conventional liquid phase epitaxial process, the entire melt takes a uniform liquid phase when the substrate is contacted with the melt. Therefore, a solid phase is precipitated on the surface of the substrate for the first time in the entire liquid phase the moment the substrate contacts the melt. For this reason, it is presumed that in order to start the growth of a single crystalline film, a relatively large nucleation energy is necessary. Therefore, it is considered that since the nucleation energy is large, when the film begins to be formed at the interface between the substrate and the film, the crystallinity of the initial film is disturbed at that interface, and the crystallinity of the film succeedingly deposited thereon reflects the disturbance.

On the other hand, according to the present invention, as shown in FIG. 6(b), the solid phase portion 5 is preliminarily made co-existent in the melt 3 before the substrate 6 is contacted with the melt 3. In this state, as viewed microscopically, melting and precipitating occur at the interface between the solid phase portion 5 and the liquid phase portion 4. Therefore, it is considered that even when the substrate 6 is then contacted with the liquid phase portion, the film begins to be smoothly and gradually grown, so that the single crystalline film having good crystallinity can be obtained. At that time, a given lattice mismatching exists between the surface of the substrate and the epitaxial film and the crystallinity is similar between them, the relaxed structure is formed. When the epitaxial film was homoepitaxially grown or when condition was set to cause no lattice mismatching, the epitaxial film became the strain structure.

In order to form a single crystal of lithium niobate-lithium tantalate, a melt with which a substrate is to be contacted may be composed mainly of $Li_2O$, $Nb_2O_5$, $Ta_2O_5$ and a flux, and an additive may be added thereto, if necessary. A charged amount of $LiO_2$ is ordinarily set almost equal to the total charging amount of $Nb_2O_5$ and $Ta_2O_5$ in terms of moles, but the compounding ratio may be varied. The melt is considered to be a pseudo-ternal composition of $LiNbO_3$-$LiTaO_3$-the melting medium (flux). Further, this melt is also considered to be a pseudo-binary composition of $LiNb_{1-x}Ta_xO_3$-the melting medium (flux) composed of $LiNb_{1-x}Ta_xO_3$ as the solute component and the medium composition (flux). Such a flux, $V_2O_5$, $B_2O_3$, $MoO_3$ and $WO_3$ are preferably recited.

EXAMPLES

In the following, more specific experimental results will be explained.

(Experiment 1)

The liquid phase epitaxial process was effected by the way explained in connection with FIGS. 5 and 6 according to the above-mentioned temperature schedule of FIG. 5. A substrate of a single crystal of lithium tantalate having a full width at half maximum (FWHM) of an X-ray rocking curve given in Table 1 was used, and a single crystalline film of lithium niobate-lithium tantalate was formed on the surface of the substrate. The charged composition of a melt 2 was $LiNbO_3$: $LiTa_3$: $LiVO_3$=5:15:80.

A melt 2 was stirred at a sufficiently high temperature $T_1$ (1000° C. to 1300° C.) for not less than 3 hours, thereby obtaining a sufficiently uniform liquid phase. Then, after the melt was cooled to the holding temperature $T_2$, it was held for not less than 12 hours until nuclei of a solid solution corresponding to an oversaturation amount occurred to precipitate a solid phase 5. At that time, the liquid phase portion 4 of the melt was in a saturated state at the temperature $T_2$, and both the liquid phase portion 4 and the solid phase portion 5 composed of the solid solution were present. Then, the melt 3 was cooled from $T_2$ to the film-forming temperature $T_3$ lower than $T_2$ by a supercooled degree of $\Delta T$, and immediately thereafter a substrate 6 was contacted with the liquid phase portion 4, thereby forming a film on the substrate. The supercooled degree $\Delta T$ was 10° C.

The thus resulting epitaxial films all had a composition of $LiNb_{1-x}Ta_xO_3$. The composition of each of the epitaxial films was measured. In the above, the rate of tantalum in the film was varied as shown in Table 1 by changing the film-forming temperature. The FWHM of the X-ray rocking curve of each epitaxial film was measured, and are shown in Table 1. The lattice mismatching between the single crystal substrate of lithium tantalate and each epitaxial film was measured, and are shown in Table 1.

The FWHM of the X-ray rocking curve was measured according to the double crystal method by using reflection at a (0012) plane. As incident X-rays, the CuKα line was used, and a (422) plane of a single crystal of GaAs was used. The FWHM of the single crystal substrate of lithium tantalate was 13 or 30 (arc sec.). The FWHM of the X-ray rocking curve of a single crystal substrate of lithium niobate having an optical grade was 6.8 to 6.9 (arc sec.).

The FWHM of the X-ray rocking curve will be explained. The crystallinity of the single crystal substrate and the epitaxial film can be evaluated by the FWHM of the X-ray rocking curve. In general, it is judged that the smaller the FWHM, the better is the crystallinity of the single crystal. Since this value itself varies depending upon a standard crystal used in an X-ray measuring device, etc., its absolute value cannot be specified.

However, it was a common knowledge that the crystallinity of the epitaxial film prepared by the liquid phase epitaxial process would be strongly influenced by that of the single crystal substrate. Therefore, it has been considered that whether the crystallinity of the solid solution film produced is good or not must be judged based on the FWHM of the X-ray rocking curve as a standard.

The crystalline structure of each epitaxial film was evaluated by measuring an asymmetrical refraction reciprocal lattice mapping at a (2 2 12) plane with use of an x-ray diffraction device. A CuKa line was used as incident X-rays. 4 Ge (220) crystal and 2 Ge(220) crystal were used as monoclometers on an incident side and an emitting side, respectively. Evaluation results are shown in Table 1.

TABLE 1

| | $LiNb_{1-x}Ta_xO_3$ film prepared | | | | |
|---|---|---|---|---|---|
| Substrate FWHM [sec] | FIGURE "x" | Lattice mismatch between substrate % | Crystalline structure | FWHM [sec] | Threshold in light damage [W/cm²] |
| 13 | 0 | 0.11 | Relax | 7 | 8 |
| 13 | 0.1 | 0.10 | Relax | 7 | 20 |
| 13 | 0.3 | 0.08 | Relax | 7 | ≧100 |
| 13 | 0.5 | 0.06 | Relax | 7 | ≧100 |
| 13 | 0.7 | 0.03 | Relax | 7 | ≧100 |
| 13 | 0.8 | 0.02 | Relax | 7 | ≧100 |
| 13 | 0.9 | 0.01 | Relax | 9 | ≧100 |
| 13 | 0.95 | 0.006 | Strain | 14 | 0.2 |
| 30 | 0 | 0.11 | Relax | 7 | 8 |
| 30 | 0.1 | 0.10 | Relax | 7 | 16 |
| 30 | 0.3 | 0.08 | Relax | 7 | ≧100 |
| 30 | 0.5 | 0.06 | Relax | 7 | ≧100 |
| 30 | 0.7 | 0.03 | Relax | 7 | ≧100 |
| 30 | 0.8 | 0.02 | Relax | 8 | ≧100 |
| 30 | 0.9 | 0.01 | Relax | 15 | ≧100 |
| 30 | 0.95 | 0.006 | Strain | 42 | 0.1 |

As is seen from Table 1, when the epitaxial film took the strain structure, the FWHM of the epitaxial film conspicuously increased, and was greater than that of the substrate. Owing to this, a threshold value of optical damage was as small as about 0.1 W/cm², so that such an epitaxial film was not practically applicable. The FWHM of such an epitaxial film is greater than or almost equal to that of the substrate.

To the contrary, when the epitaxial film took the relaxed structure, the epitaxial film having a FWHM far smaller than that of the substrate was formed. As a result, the threshold value was conspicuously increased to not less than 100 W/cm². Thus, the epitaxial film having the FWHM far smaller than that of the optical single crystalline substrate has not be found in the prior art.

The present inventors have succeeded in maintaining the threshold value of the optical damage at an extremely high level of 100 W/cm² or more by suppressing the lattice mismatching between the substrate and the epitaxial film to not more than 0.08%.

Figure 1:
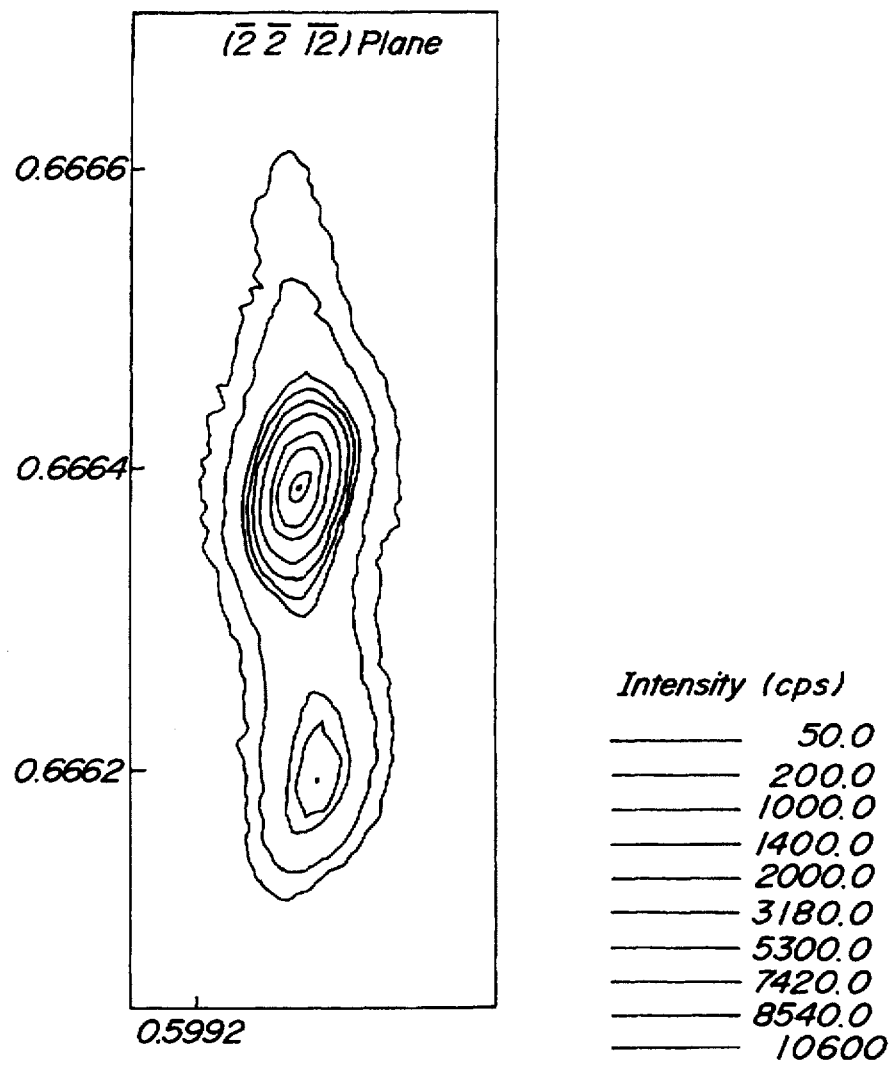
FIG. 1 is a diagram showing an example of the asymmetrical reflection reciprocal lattice mapping of the strain structure.
Figure 2:
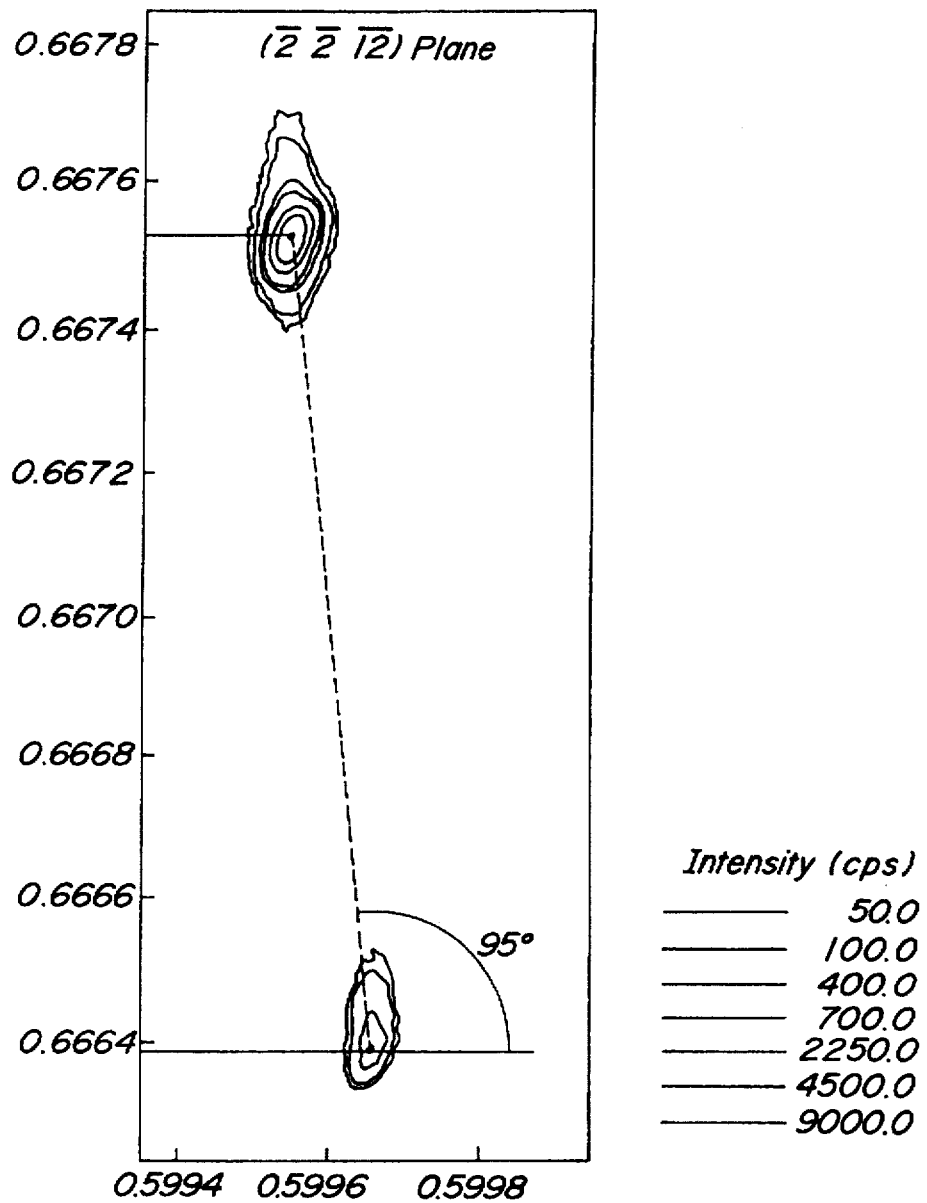
FIG. 2 is a diagram showing an example of the asymmetrical reflection reciprocal lattice mapping of the relaxed structure.

FIG. 1 corresponds to the measurement result of the strain structure having a the composition of the film of Table 1 in which the FWHM is 13 sec. and x is 0.95, and FIG. 2 corresponds to the measurement result of the relaxed structure having a the composition of the film of Table 1 in which the FWHM is 13 sec. and x is 0.70.

Results similar to the above ones were obtained with respect to KLN epitaxial films and KLNT epitaxial films formed on KLN or KLT.

As mentioned above, according to the present invention, the optical single crystalline article in which the epitaxial film is provided on the substrate of the optical single crystal, the crystallinity of the epitaxial film can be made excellent and its optical damage resistance can be conspicuously enhanced, without being directly influenced by the the crystallinity of the single crystalline substrate.

What is claimed is:

1. An optical single crystalline article comprising a substrate made of an optical single crystal and an heteroepitaxially grown film formed on said substrate and made of an optical material, wherein a crystalline structure of said heteroepitaxially grown film is a relaxed structure.

2. The optical single crystalline article set forth in claim 1, wherein the substrate and the epitaxial film fundamentally possess similar crystalline structures, their lattice constants differ from each other, and the epitaxial film is formed by heteroepitaxially growing.

3. The optical single crystalline article set forth in claim 2, wherein the crystalline system is the same and substituting elements differ between the substrate and the epitaxial film.

4. The optical single crystalline article set forth in claim 2, wherein the substrate and the heteroepitaxially grown film are selected from the following pairs (1) $LiNbO_3$ and $LiTaO_3$; (ii) $K_3Li_2Nb_5O_{15}$ and $K_3Li_2Ta_5O_{15}$; and (iii) $Y_3Fe_5O_{12}$ and $Bi_3Fe_5O_{12}$.

5. The optical single crystalline article set forth in claim 2, wherein between the substrate and the epitaxial film, the crystalline system is the same and the substituting elements are the same, but the composition ratio of the substituent elements differs between the substrate and the epitaxial film.

6. The optical single crystalline article set forth in claim 2, wherein the substrate and the heteroepitaxially grown film are selected from the group consisting of $LiNb_{1-x}Ta_xO_3$, $K_3Li_2(Ta_xNb_{1-x5}O_{13})$, $KLi_{2-x}Nb_{5+x}O_{15+2x}$, and $Ba_{1-x}Sr_xNb_2O_6$.

7. The optical single crystalline article set forth in claim 1, wherein said substrate comprises a single crystal of lithium niobate or a single crystal of lithium tantalate, and said epitaxial film comprises a single crystal of lithium niobate-lithium tantalate.

8. The optical single crystalline article set forth in claim 1, wherein a lattice mismatch between said substrate and said epitaxial film is not less than 0.4% and not more than 1%.

9. The optical single crystalline article set forth in claim 8, wherein said lattice mismatch between the substrate and the epitaxial film is not more than 0.08%.

10. The optical single crystalline article set forth in claim 1, wherein the epitaxial film is formed by a single crystal of lithium niobate-lithium tantalate, and a rare earth element is incorporated into the single crystal as a doping component.

11. The optical single crystalline article set forth in claim 10, wherein the rare earth element is selected from the group consisting of Nb, Er, Tm, Ho, Dy and Pr.

12. The optical single crystalline article set forth in claim 11, wherein at least one kind of additive elements selected from the group consisting of zinc, scandium, magnesium, indium, titanium and vanadium are incorporated into the epitaxial film or the substrate.

13. The optical single crystalline article set forth in claim 1, wherein the heteroepitaxially grown film includes a first heteroepitaxially grown film and a second heteroepitaxially grown film formed on said first heteroepitaxially grown film, and the refractive index of the first heteroepitaxially grown film is smaller than that of the second heteroepitaxially grown film.

14. An optical element comprising the optical single crystalline article set forth in claim 1.

15. The optical element set forth in claim 14, which is one selected from the group consisting of an optical modulator, an optical switch, an optical amplifier, a second higher harmonic generator element, and an optical integrated circuit for an optical fiber gyrometer.

* * * * *